United States Patent [19]
Zumsteg et al.

[11] 4,071,797
[45] Jan. 31, 1978

[54] QUARTZ PIEZO-ELECTRIC ELEMENT VIBRATING IN A COUPLED MODE

[75] Inventors: Alphonse Ernst Zumsteg; Jean Engdahl, both of Bienne; Raymond Huguenin, Port, all of Switzerland

[73] Assignee: Societe Suisse pour l'Industrie Horlogere Management Services S.A., Bienne, Switzerland

[21] Appl. No.: 650,643

[22] Filed: Jan. 20, 1976

[51] Int. Cl.$^2$ .................................... H01L 41/04
[52] U.S. Cl. ............................................. 310/361
[58] Field of Search ............ 310/9.5, 9.6, 9.7, 360, 310/361

[56] References Cited

U.S. PATENT DOCUMENTS

| | | | |
|---|---|---|---|
| 2,218,200 | 10/1940 | Lack et al. | 310/9.5 |
| 2,306,909 | 12/1942 | Sykes | 310/9.5 |
| 2,321,358 | 6/1943 | Bokovoy | 310/9.4 X |
| 2,574,257 | 11/1951 | Franklin | 310/9.5 |

*Primary Examiner*—Mark O. Budd
*Attorney, Agent, or Firm*—Griffin, Branigan and Butler

[57] ABSTRACT

This specification describes a rectangular quartz crystal which has been designed with specific length-width-thickness ratios whereby vibration takes place in the thickness shear mode strongly coupled with flexural vibrations. The choice of the specific ratios permits an improved performance insofar as dynamic capacitance range, temperature dependent variations of frequency and finally quality factor are concerned. The dimensions and proportions make the crystal suitable for use as a high frequency time piece resonator.

9 Claims, 10 Drawing Figures

QUARTZ PIEZO-ELECTRIC ELEMENT VIBRATING IN A COUPLED MODE

BACKGROUND OF THE INVENTION

As has already been pointed out in British Specification No. 1,401,042 quartz crystals of frequencies greater than 1 MHz have generally tended to be of a circular lens form and such forms suffer from various disadvantages including, of course, the problem of space occupation and the difficulty of manufacture including mounting. Accordingly, it was concluded that a rectangular form of quartz crystal would be much preferable, particularly where it was desired to use such a quartz as a resonator in a wrist watch. In such application the quartz resonator is subject to many problems not found in other applications. For example in view of a large variation of temperature it may be found necessary to provide arrangements for bringing about compensations and in any event it is desirable to provide a resonator having as flat a temperature characteristic as possible. Such resonator should likewise provide high dynamic capacitance. In view of the severe stresses which such a crystal must constantly undergo the mounting arrangements must be perfectly secure and must not in any way influence the frequency of the crystal. Thus, it has been proposed that where a high frequency quartz is to be used that such be of the AT-type in which, of course, as is well known principal vibrations occur in thickness shear. In order to deal with the quartz mounting problem, as pointed out in the British specification referred to hereinabove, an energy trapping arrangement may be provided whereby the ends of the rectangular bar are practically free of vibration and thus do not, in fact, influence the frequency of the portion of the crystal located between the electrodes.

Various problems remain however in respect of the earlier specification which derive from coupled flexural vibrations which tend to disturb the Q-factor. If we assume a rectangular AT-cut bar of quartz having length X, thickness Y and width Z it will be found that XY shear vibrations are always coupled to XY flexural vibrations. For ratios X/Y of high value, for example 30 or greater, regions will be found where the shear vibrations clearly dominate the flexural vibrations. The characteric curves will show a horizontal portion or shelf where the frequency of the vibrating plate will be neighbouring that which would correspond to pure shear at the same time remaining slightly higher.

For low ratios of length to thickness this shelf no longer exists and one passes imperceptibly from zones where flexural vibrations dominate to those where shear dominates. The technique of energy trapping which tends to limit the shear energy within a limited portion of the plate does not act on the flexural mode which may propagate freely along the length. Thus, mounting the resonator at its ends when such resonator has its long dimension according to X may be extremely critical since it is always necessary to find points where the vibration amplitude is zero. If however one should choose to use the Z' rotated axis as the long axis of the plate there will not be the same mounting problems since the flexural vibrations end up on the free faces of the resonator. Considerable work has been done on the problem of coupling between thickness shear and flexural vibrations in crystal plates, see for example the paper published by Raymond D. Mindlin in the Journal of Applied Physics, Vol. 22, No. 3, March 1951. This paper provides the first theoretical approach for the calculation of resonator frequencies of a rectangular plate taking into account flexure and shear vibrations in respect of the elastic constants of the material.

The present invention goes a step further in providing an arrangement which takes into account temperature variations which affect the elastic constants, thereby modifying the thermal frequency coefficients.

In the U.S. Pat. No. 2,306,909 to Sykes, resonators have been described having their greatest dimension parallel to the Z' axis in respect of an AT-cut type of resonator. Such resonators were almost square in form as shown in FIGS. 10 and 11 of the aforementioned patent. No mention therein was made of the energy trapping technique. Furthermore, to the best of our knowledge up to the present time very little has been known concerning the influence of the (X)–(Y) ratio on the thermal coefficient of frequency, on the dynamic capacitance and on energy trapping when the ratio (X)–(Y) has a value substantially less than 30, for example 3 – 8.

Thus, the purpose of the invention is to provide a quartz resonator having such a selection of dimensional ratios length-to-width-to-thickness as will result in rectangular form resonators of very small width and employing the energy trapping principle, this latter being obtained either by an extra thickness of metallization or a thinning down of the outer extremities of the resonator through chemical attack, ion milling, etc. and for which the greatest dimensions will be found along the axis Z', these ratios permitting the mastery of the behaviour in temperature variations, the obtaining of a dynamic capacity of maximum value, a high quality factor and a minimization of tolerance effects during manufacturing.

SUMMARY OF THE INVENTION

The invention accordingly provides a piezoelectric resonator cut from a quartz crystal in a rotated Y-cut of approximately 35°0' and having its greatest dimensions along Z' (YZW approximately equal 35°0') arranged to vibrate in a mode which is the resultant of coupling of a thickness shear XY' mode and a flexural mode XY', the width-thickness ratio of the resonator being selected from certain ranges in accordance with the flexural harmonics. Thus, for the second flexural harmonic the range may be between 1.1 and 1.9, for the fourth flexural harmonic such ratio may be between 2.2 and 3.6. Other ratios may likewise be chosen on a basis as shown hereinafter. Preferably, the resonator will be operated in an energy trapping mode and for this reason electrodes will be placed thereon confined to a small portion of the opposing surfaces between which the thickness shear vibrations normally take place.

$C'_{66}$ represents a shear modulus or coefficient around Z and $\rho$ is representative of the density. Such a frequency would be that of an infinite plate.

Figure 8:
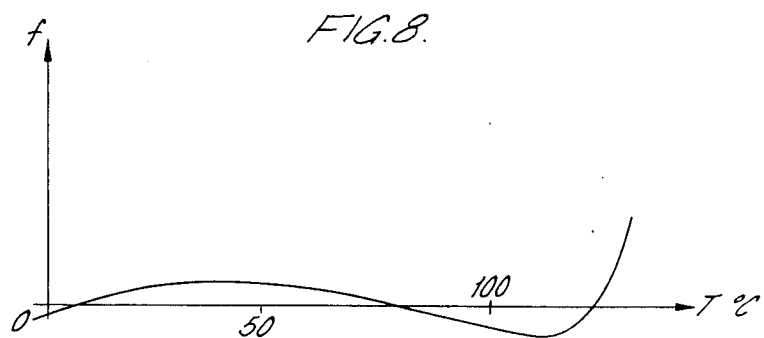

FIG. 8 represents the frequency of resonance as a function of the temperature of one example of a rectangular resonator in accordance with the present invention.

Figure 9:
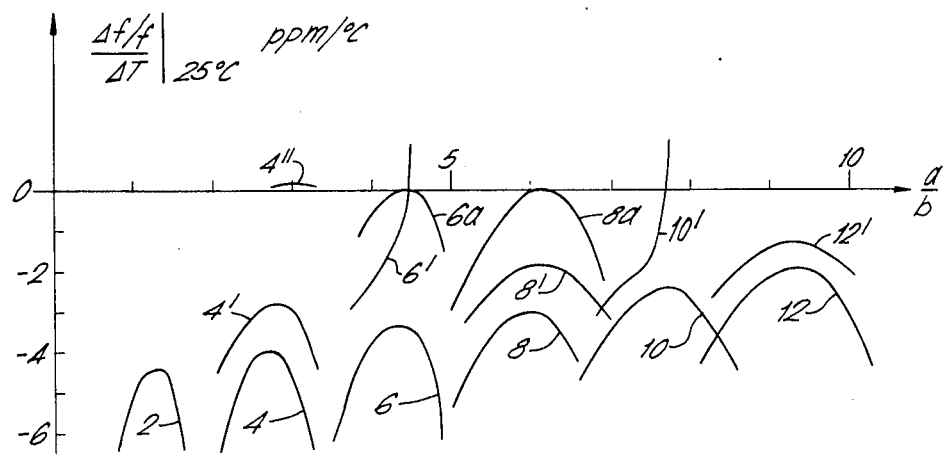

FIG. 9 represents the linear temperature coefficient of the frequency at 25° C for rectangular resonators according to this invention.

Figure 10:
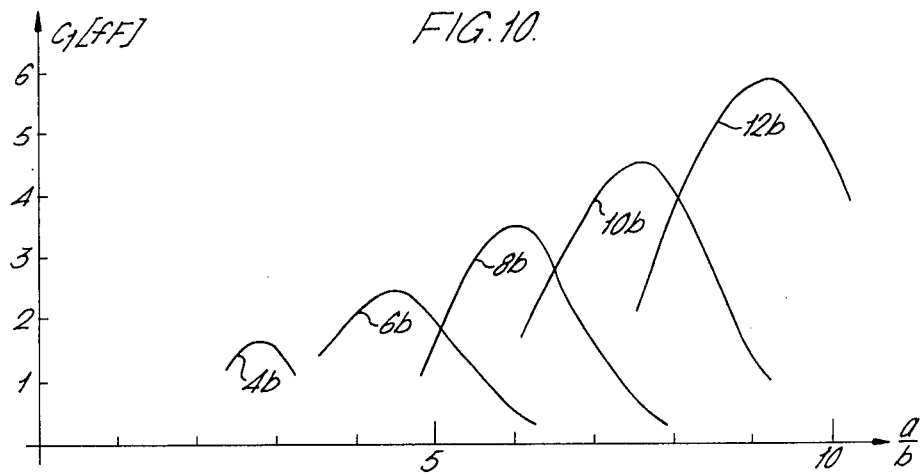

FIG. 10 represents the dynamic capacity of rectangular resonators in accordance with the present invention.

DETAILED DESCRIPTION

With the objective of diminishing the overall dimensions and the price of piezo-electric quartz resonators of the AT cut for frequencies below 8 MHz they have been given rectangular forms with or without a convex surface. In these rectangular resonators the thickness shear vibration mode is disturbed by coupling with surface shear in the XZ' plane and with flexural vibrations in the XY' plane. To relieve such difficulties as are caused by the coupling with the surface shear which is accidental in view of the elastic constant $C_{56}'$ it is sufficient to give the resonator dimensions such that the frequency of the thickness shear vibration is almost exactly at the centre of the frequency of two successive harmonics of the surface shear vibration. The necessary theory for the calculation of correct dimensions and proportions is well known.

In a quartz plate vibrating in thickness shear XY' coupling with the flexural mode XY' is brought about by conditions at the limiting edges, i.e. the elastic forces are zero on the free external faces of the body. This is a very general phenomenon which may take place likewise in an isotropic body having finite dimensions. The magnitude of this coupling is an almost periodic function of the ratio of the dimensions of the crystal in the X direction to the thickness and it diminishes as the ratio increases. If one wishes to neglect entirely the effects of coupling it is necessary that the dimension of the crystal in the X direction or that of the electrode in the same direction, should the resonator use the energy trapping technique, be large relative to the thickness.

Figure 1:
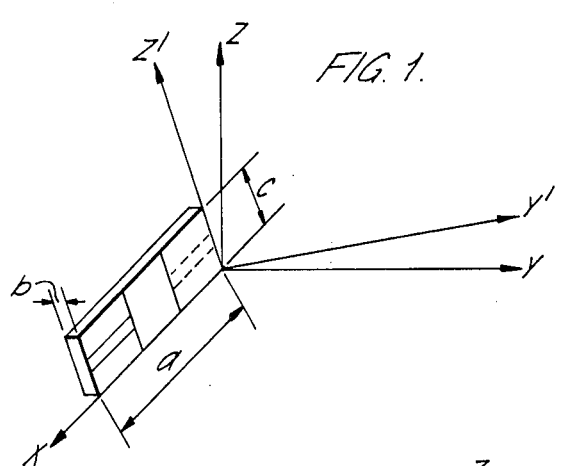
FIG. 1 represents a rectangular resonator of the AT-cut having flat surfaces and the greatest dimension oriented along the X axis.
Figure 2:
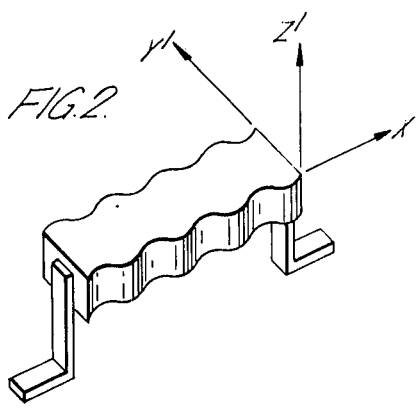
FIG. 2 represents a rectangular resonator of the AT-cut operating in the flexural mode XY' which propagates itself in the X direction and of which a portion of the energy in this mode is absorbed at the ends of the X axis or close to this axis.

FIG. 1 shows a quartz resonator in the AT-cut having a rectangular form with electrodes at the centre without convex surfaces and for which the greatest dimension, the length, is parallel to the X axis. Such resonators have already been made having ratios $a/b \geq 30$. Such resonators present two inconvenient features:

Initially, the ratio $a/b$ must be greater than 30 in order to obtain a sufficient attenuation of the thickness shear vibrations between the electrodes and the edge of the resonator. Secondly, the flexural mode XY' which is coupled to the thickness shear and which is propagated in the direction X (see FIG. 2) is not subjected to the energy trapping arrangements and the fixing of the resonator on its ends will always absorb a portion of the flexural mode energy.

To obtain usable resonators it is necessary to provide suspensions of very high quality which do not absorb vibration and even then it is difficult as a matter of manufacture to obtain a sufficient reproducibility for high quality resonators.

Figure 3:
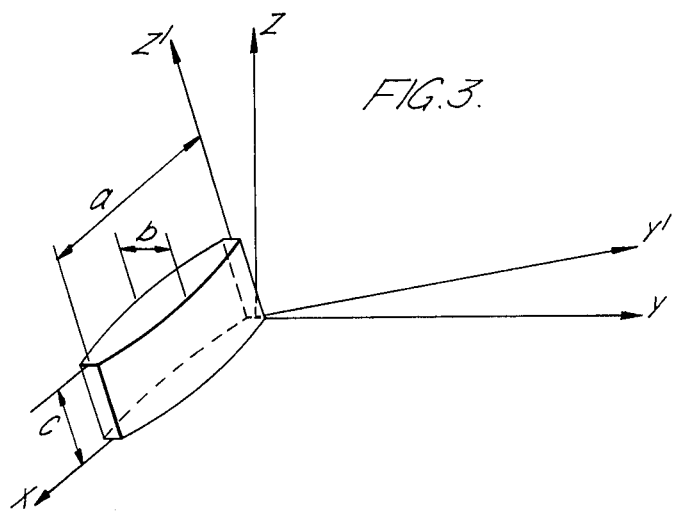
FIG. 3 shows a rectangular resonator configuration of the AT-cut having convex surfaces and for which the greatest dimension is along the X axis.

FIG. 3 shows a resonator configuration without electrodes having its length parallel to the axis X and which possesses two convex surfaces. These latter provoke a very substantial energy trapping which permits a reduction of the ratio $a/b$ but at the same time necessitates a curved machining which is difficult and expensive.

The present invention was arrived at following certain considerations:

1. Pure thickness shear does not exist in a body having finite dimensions.
2. In a quartz plate thickness shear vibrations XY' are always coupled to flexural vibrations in a plane XY'.
3. A flexural mode XY' is propagated in the direction X.
4. One may not trap energy from the flexural mode XY' with the same procedure utilized to trap the thickness shear vibrations.

Figure 4:
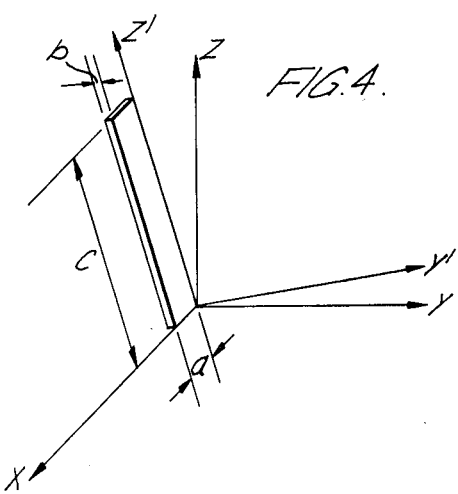
FIG. 4 shows a resonator configuration according to the present invention for which the greatest dimension is along the Z' axis and the ratio of width to thickness is very small.
Figure 7:
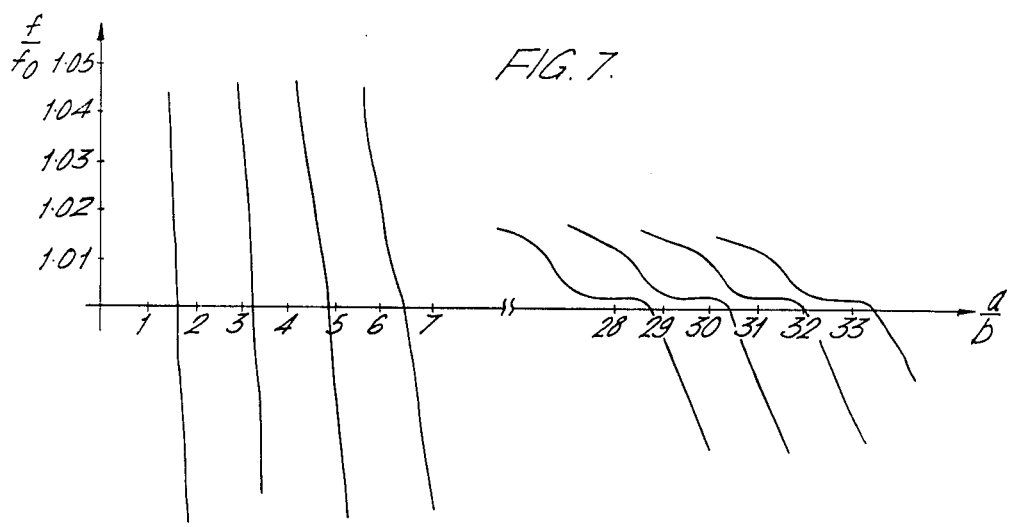
FIG. 7 is a diagram of normalized resonance frequencies of a rectangular resonator of the AT-cut as a function of the ratio $a/b$ where $a$ is the dimension along the X axis and $b$ is the thickness. The frequencies are normalized relative to the frequency $f_o$, defined as $$f_0 = \frac{1}{2b} \sqrt{\frac{C'_{66}}{\rho}}$$

These four determinations show that it is necessary to avoid fastening the resonator at places which are close to the X axis. A rectangular resonator with the length parallel to the axis Z' might be a solution. However, should one wish to have very narrow resonators that is to say with a very small ratio $a/b$ as shown in FIG. 4 where for example $a/b$ would be about equal to 2.8, coupling between the thickness shear and the flexure XY' is enormous and none of the properties due to this coupling are known except the resonance frequency. Here is to be found a first difficulty, for the frequency of resonance depends not only on the thickness but also on the very important matter of width, as shown in FIG. 7. Thus, during manufacture it is necessary to keep very close tolerances on two dimensions in place of one single dimension. This difficulty may be overcome by chemical etching during the tuning process. Other difficulties are overcome through the ratio selections proposed by this invention.

The first theory which took into account in a detailed and quantitative manner the couplings between thickness shear and flexure XY' was that established by R. D. Mindlin in 1951 as hereinbefore referred to. It is valid for thin crystalline plates of monoclinic symmetry and is applicable thus to quartz plates of the rotated Y-cut.

FIG. 7 shows qualitatively the result for an AT-cut. It may be determined that for large ratios $a/b$, for example $a/b = 30$, there are "steps", that is to say regions for which the frequency does not depend on the width. It may be demonstrated that on these "steps", coupling between thickness shear and flexural XY' vibrations is minimum. The influence of this coupling on the properties and dimensioning of the resonator is negligeable. For small ratios $a/b$, for example $a/b = 2.8$, these steps no longer exist and the ever important coupling influences vary strongly the electrical and thermal properties of the resonator.

By calculating the behaviour of the resonance frequency as a function of the temperature we have obtained an extension to the existing theories. FIG. 8 represents a curve following such a calculation. Such curves resemble those of the AT cut resonators but they are asymmetric and have a higher point of inflexion. The lower point of inversion may be placed for example around 25° and the portion of the corresponding parabola is very open and extends at least to 50°. This quadratic behaviour is very favourable to resonators which are required to work at ambient temperatures such as may be found for instance in a wrist-watch.

FIG. 9 gives the linear temperature coefficient of the frequency $T_f$ at 25° C as a function of the dimensional ratios and for different angles of cut. Curves 2, 4, 6, 8, 10 and 12 are calculated for an angle of 35°15′, curve 6a for 34°30′ and curve 8a for 34°36′. Curves 4′, 6′, 8′, 10′ and 12′ are measured for an angle of cut of 35°15′ and curve 4″ for an angle of cut of 34°48′. Curves 6′ and 10′ are disturbed by the surface shear vibration which has not been taken into account by the theory. The agreement between theory and experience has proven to be quite good and especially so for the values of the ratio $a/b$ corresponding to to the peaks of the curves. Such results seem to be new and show that $T_f$ depends in a parabolic and cyclic manner from the dimensional ratio $a/b$.

As shown in FIG. 10 the value of the dynamic capacity $C_1$ depends equally in a parabolic and cyclic manner from the ratio $a/b$, FIG. 4. Curves 4b, 6b, 8b, 10b and 12b represent measured values. $C_1$ is maximum in the neighborhood of the values of the ratio $a/b$ corresponding to the summits of the parabolas of $T_f$.

From the results obtained it appears that the following values of the ratio $a/b$ are particularly favourable to industrial application:

$a/b \simeq 2.8, 5.9, 9.1$

The values ~1.35, 4.4 and 7.4 many also be utilized but it will be necessary to deviate slightly therefrom in order to avoid surface shear coupling effects.

This invention also provides the advantage that the energy trapping for coupled modes is much greater than that known up until the present time for simple modes. Rectangular resonators have been made without convex surfaces for a frequency of approximately 4.19 MHz with ratios $c/b < 20$ and $a/b < 2.95$ and which present a quality factor which is reproducible and greater than 500,000.

Figure 5:
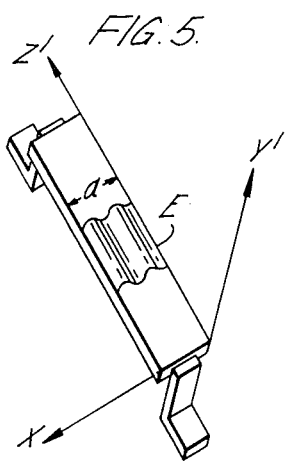
FIG. 5 shows a rectangular resonator according to the present invention wherein one may see how the flexural mode XY' vibrations end up on the free faces X which are no longer utilized for supporting the resonator.
Figure 6:
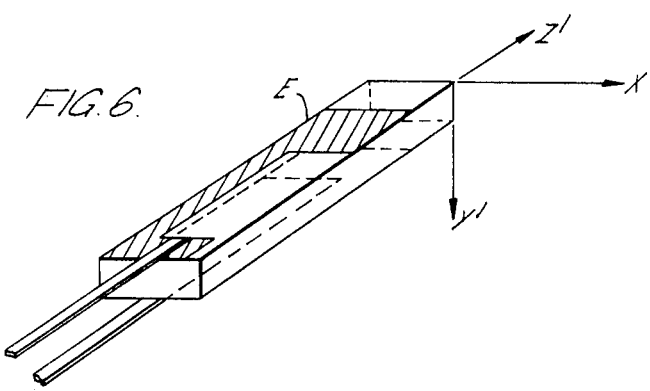
FIG. 6 represents a rectangular resonator according to this invention which is held only at one extremity and for which the energy trapping zone is not necessarily midway along the length.

The following table shows experimental results actually obtained:

| a | $f_o$[Hz] | Q | R[Ω] | L[H] | $C_1$[fF] | $C_o$[pF] | $d\frac{\Delta f}{f}/d\theta$ [pm/degree C] |
|---|---|---|---|---|---|---|---|
| 1.19 | 4,285,883 | 501,900 | 44 | 0.82 | 1.69 | 1.1 | + 0.43 |
| 1.25 | 4,197,801 | 546,000 | 44 | 0.92 | 1.56 | 0.9 | + 0.50 |
| 1.25 | 4,198,365 | 672,800 | 35 | 0.90 | 1.60 | 0.9 | + 0.32 |
| 1.25 | 4,197,304 | 575,800 | 37 | 0.81 | 1.78 | 0.9 | + 0.50 |
| 1.125 | 4,198,808 | 483,700 | 45 | 0.82 | 1.74 | 0.9 | — | a — dimension a (mm) [b = constant 0.4 mm]
$f_o$ — measured frequency
Q — quality factor
R [Ω] — resistance at resonance (ohms)
L [H] — inductance (henrys)
$C_1$ [fF] — dynamic capacitance ($10^{-15}$ F)
$C_o$ [pF] — static capacitance ($10^{-12}$ F)
$d\frac{\Delta f}{f}/d\theta$ [ppm/degree C] — linear temperature coefficient of frequency at 25° C Reference is made now to FIGS. 4, 5 and 6. These, in fact, represent embodiments of how the invention may be carried out. Thus FIG. 4 shows the arrangement of the quartz related to its crystallographic axis in which c is the length and follows the Z′ axis, a is the width and is along the X axis and b is the thickness and is along the Y′ axis. In FIG. 5 is shown a mounted bar quartz which has been cut as shown in FIG. 4. Herein it will be clear that the centre electroding E across width a is such as to provoke a thickness shear type of vibration XY′ coupled to a flexural vibration also XY′. As to the direction Z′ in this case a thickness twist type of vibration may arise. In view of the choice and arrangement of the electrode E the energy trapping principle will apply so as to obtain an exponential diminution of this latter vibration towards the ends of the bar which are utilized as mounting points.

Moreover, as shown by the arrangement of FIG. 6 it is unnecessary that the zone of trapped energy be located in the centre of the bar according to its length and one may even arrange to fasten the bar at a single extremity. Thus, in FIG. 6 the electrode zone E is in proximity to, even though somewhat separated from one end of the bar whereas the connecting electrodes are at the other end of the bar; as can be appreciated the bar can itself be mounted at one end. With this as in the FIG. 5 embodiment a very high quality factor is obtainable.

What we claim is:

1. A piezo-electric resonator in rectangular bar form cut from a quartz crystal in a rotated Y orientation of 34°48′ ± 20′ and having its greatest dimension along Z′ (YZW 34°48′ ± 20′ arranged to vibrate in a mode which is the resultant of coupling of a thickness shear (XY′) mode and a flexural (XY′) mode, the width (X)--thickness(Y′) ratio of the resonator being selected from the following ranges:

between 1.1 and 1.9 for the second flexure harmonic
between 2.2 and 3.6 for the fourth flexure harmonic
between 3.6 and 5.3 for the sixth flexure harmonic
between 5.1 and 6.8 for the eighth flexure harmonic
said quartz crystal being provided with electrodes on its opposed XZ′ surfaces, such electrodes extending over the entire width X of the resonator but having a length in the Z' direction less than the length of the resonator thereby to establish an energy trapping zone within the portion of the resonator between the electrodes.

2. A piezo-electric resonator as defined in claim 1 wherein the electrodes are confined to a central zone along the length Z'.

3. A piezo-electric resonator as defined in claim 1 wherein the electrodes are located proximate one end of the bar.

4. A piezoelectric resonator as defined in claim 1 having mounting supports at the end (XY') surfaces whereby flexural vibrations XY' arriving at the Y'Z' surfaces are unrestrained.

5. A piezo-electric resonator as defined in claim 4 having mounting supports at one (XY') end surface only.

6. A piezo-electric resonator in rectangular bar form cut from a quartz crystal in a rotated Y orientation of approximately 34°48', ± 20' and having its greatest dimension along Z' (YZW 34°48' ± 20' said resonator having a width(X)-thickness(Y') ratio approximately equal to one of the values 1.35, 2.8, 3.125, 4.4, 5.9, said ratio being such that said resonator vibrates in a mode which is the resultant of coupling of a thickness shear (XY') mode and a flexural (XY') mode.

7. Method of making a rectangular quartz crystal resonator capable of vibrating in a mode which is the resultant of coupling of a thickness shear mode and a flexural mode and which exhibits a temperature dependent frequency behavior which in a temperature range of 20° C to 30° C and a tolerance of ± 2' for a given angle of cut provides a maximum frequency deviation of less than 1PPM comprising: cutting a crystal into a rectangular bar having its greatest dimension along Z', and in a rotated Y orientation of an angle falling within the zone of 34°48' ±20' (YZW 34°48' ± 20' and having a width(X)-thickness(Y') ratio of a value which is less than 6.8.

8. The method as claimed in claim 7 therein said bar is cut to have a width-thickness ratio of approximately 3.125.

9. The method as claimed in claim 7 wherein said bar is cut to have a width-thickness ratio of approximately one of the values 1.35, 2.8, 4.4, 5.9.

* * * * *